US006919773B2

(12) United States Patent
Kern et al.

(10) Patent No.: US 6,919,773 B2
(45) Date of Patent: Jul. 19, 2005

(54) MONOLITHICALLY INTEGRATED MICROWAVE GUIDE COMPONENT FOR RADIO FREQUENCY OVERCOUPLING

(75) Inventors: Stefan Kern, Waghausel (DE); Gregor Gerhard, Murrhardt (DE)

(73) Assignee: Marconi Communications GmbH, Backnag (DE)

( * ) Notice: Subject to any disclaimer, the term of this patent is extended or adjusted under 35 U.S.C. 154(b) by 0 days.

(21) Appl. No.: 10/920,862

(22) Filed: Aug. 18, 2004

(65) Prior Publication Data

US 2005/0035826 A1 Feb. 17, 2005

Related U.S. Application Data

(63) Continuation of application No. 10/149,089, filed as application No. PCT/IB00/01802 on Nov. 21, 2000, now abandoned.

(51) Int. Cl.[7] .............................. H03H 7/38; H01P 3/08
(52) U.S. Cl. .......................................... 333/33; 333/246
(58) Field of Search ........................... 333/33, 260, 246

(56) References Cited

U.S. PATENT DOCUMENTS

| | | | |
|---|---|---|---|
| 4,494,083 A | 1/1985 | Josefsson et al. | 333/33 |
| 5,093,640 A | 3/1992 | Bischof | 333/33 |

FOREIGN PATENT DOCUMENTS

| | | | |
|---|---|---|---|
| EP | 0 318 311 | 5/1989 | H01P/1/04 |

OTHER PUBLICATIONS

T.E. Kazior, et al. "A Manufacturable, Bond Wire Free Interconnect Technology for Microwave and Millimeter Wave MMICs" Jun. 1997 (4 pages).

Derrell Hill "Low Thermal Impedance MMIC Technology", Feb. 1997 IEEE Microwave and Guided Wave Letters.

Hua_Quen Tserng, et al. "Embedded Transmission–Line (ETL) MMIC for Low–Cost High–Density Wireless Communication Applications" 1997 (8 pages).

E. Holzman, et al. "An Hermetic Coplanar Waveguide–to–HDI Microstrip Microwave Feedthrough" 1998 (2 pages).

Gary S. Barta, et al. "Surface–Mounted GaAs Active Splitter and Attenuator MMIC's Used in a 1–10–GHz Leveling Loop" 1986 (5 pages).

*Primary Examiner*—Stephen E. Jones
(74) *Attorney, Agent, or Firm*—Taylor & Aust, P.C.

(57) ABSTRACT

A monolithically integrated microwave guide component for overcoupling high frequencies includes a first micro-waveguide that is structured on a micro-waveguide chip, and comprises a second micro-waveguide that is structured on a carrier substrate. The microwave guides are contacted to one another by a chip through-plating. The microwave guides each include, in the contact region, an integrated compensating structure that serves to compensate for reflections.

8 Claims, 1 Drawing Sheet

MONOLITHICALLY INTEGRATED MICROWAVE GUIDE COMPONENT FOR RADIO FREQUENCY OVERCOUPLING

This application is a continuation of U.S. Application No. 10/149,089, filed Oct. 28, 2002 abandoned, which was the National Stage of International Application No. PCT/IB00/01802, filed Nov. 21, 2000.

BACKGROUND OF THE INVENTION

1. Field of the Invention

The present invention relates to a monolithically integrated microwave guide component.

2. Description of the Related Arts

Microwave guide components of the generic kind are known. These serve for the coupling in or out of electromagnetic waves of a high frequency which are supplied via a microwave guide. Such microwave guide components consist of a chip in which a conductor configured as a strip line or as a micro-strip line is integrated. This conductor is applied as is known, to the upper side of the chip. Further circuit components, for example, amplifiers, oscillators or the like, can be integrated inside the chip. The chip is arranged on or next to a carrier which likewise has a conductor designed as a strip line or a micro-strip line for the electromagnetic waves. To connect the conductor structures of the chip and of the carrier to one another, it is known to contact these to one another via a bond connection or a ribbon connection. In this connection, it is disadvantageous that such a coupling out of high frequency electromagnetic waves leads, in particular with frequencies above 10 GHz, to increased reflections due to the inductance of the coupling out line. To compensate for these reflections, compensation circuits must be provided. As a rule, this requires high space requirements on the chip. It is furthermore disadvantageous that due to the short wavelength associated with the high frequencies in assembly tolerances between the chip and carrier, or between the line structures and the coupling out line, result in the formation of parasitic elements (capacitances, inductances), which make compensation more difficult.

It is known from "DBIT—DIRECT BACKSIDE INTERCONNECT TECHNOLOGY"; IEEE, 6/97, to connect the line structures of the chip and of the carrier to one another by a via. With such a via, the reflections caused by the usual bon connection or ribbon connection are admittedly avoided, but the problem of the compensation with the coupling out of RF signals remains unsolved.

SUMMARY OF THE INVENTION

In comparison, the monolithically integrated microwave guide component in accordance with the invention provides the advantage that a compensation on coupling out RF signals is achieved in a simple manner. Since the microwave guides—of both the chip and the carrier—each have an integrated compensation structure in the contact region, the production of the RF coupling out can take place in a simple manner and an electrical design of the contact region can take place at the same time in such a way that a compensation of reflections is possible.

In one embodiment of the invention, provision is made for the compensation structures to be formed by line sections of the microwave guides which have a line width matched to the transition. The compensation structure can be hereby be integrated in a simple manner by specifying the layout of the microwave guides in the contacting region. It is in particular provided that the microwave guide associated with the chip forms a capacitively acting line section in the contact region and that the microwave guide associated with the carrier forms an inductively acting line section in the contact region. A compensation can be achieved by interaction of these line sections in the contact region with the grounding arrangement of the microwave guide component such that the line structure of the coupling out of RF signals corresponds to that of a 50 ohm standard microwave guide with sufficient accuracy.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 1:
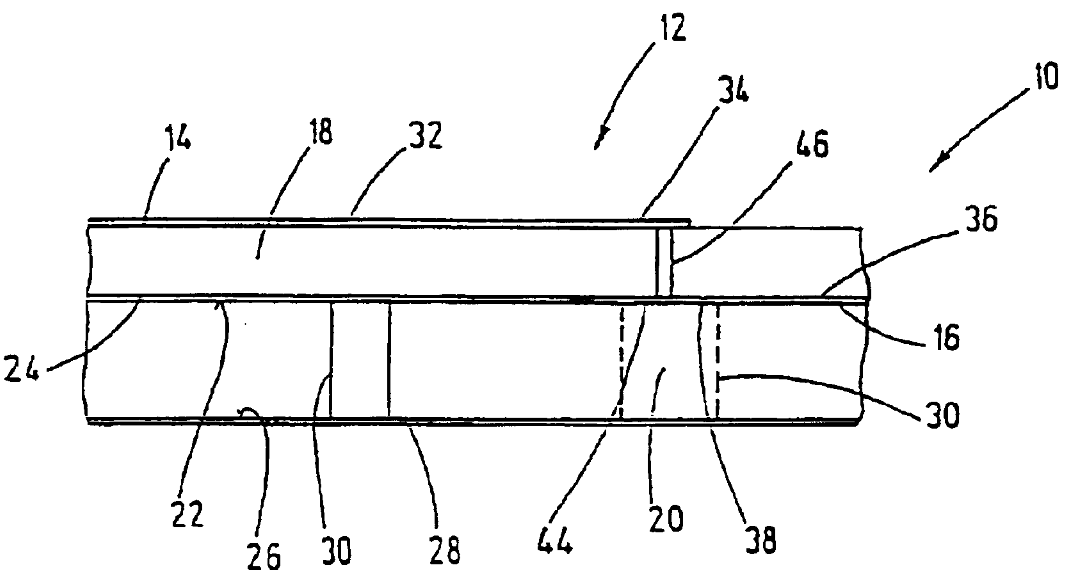
FIG. 1 is a schematic section through a monolithically integrated microwave guide component.

Referring now to the drawings, and more particularly to FIG. 1, there is shown a monolithically integrated microwave guide component 10 in a longitudinal section. Contact region 12 is shown of a first microwave guide 14 with a second microwave guide 16. Microwave guide 14 is arranged on a chip 18, for example on a GaAs (gallium arsenide) chip. Chip 18 has, for example, a thickness of 100 $\mu$m. Second microwave guide 16 is arranged on a carrier 20, for example an $Al_2O_3$ (aluminum oxide) substrate. Carrier 20 has, for example, a thickness of 254 $\mu$m. An upper side 22 of carrier 20 carries a metallic coating 24, whereas a lower side 26 on carrier 20 carries a metallic coating 28. Metallic coatings 24 and 28 are galvanically connected via through-contacts (or vias) 30 indicated here. Metallic coatings 24 and 28 serve in a known manner to make available a ground potential for circuits integrated into microwave guide component 10 which are not shown individually. These can, for example, be monolithically integrated in chip 18.

Figure 2:
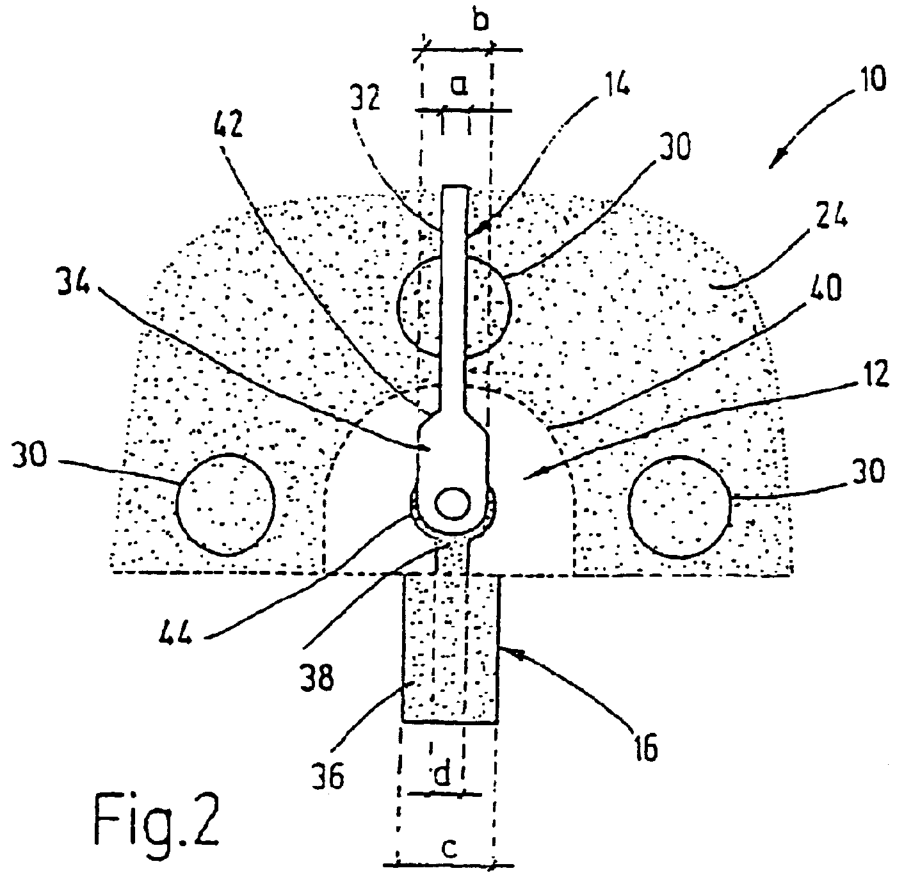
FIG. 2 is a schematic plan view of the monolithically integrated microwave guide component.

As the schematic plan view shown in FIG. 2 illustrates, microwave guide 14 consists of a first line section 32 of a second line section 34, and microwave guide 16 consists of a first line section 36 and of a second line section 38. Line sections 34 and 38 lie in contact region 12. Metallic coating 24 forms a recess 40 in contact region 12 which is visible in FIG. 2 and which as it were engages around contact region 12. Through-contacts 30 through carrier 20 are arranged symmetrically around contact region 12.

Microwave guide 14 includes in its line section 32 a width a and in its line section 34 a width b, with line section 34 being wider than line section 32. A taper structure 42 is formed at the junction between thinner line section 32 and thicker line section 34.

Microwave guide 16 has a width c in its line section 36 and a width d in its line section 38. Here, width d is smaller than width c. In the direct contact region 12, line section 38 forms a contact zone 44. Microwave guides 14 and 16 are connected to one another via a through-contact 46 through chip 18. Through-contact 46 connects line sections 34 and 38.

Line sections 32 and 34 of microwave guide 14 and line section 36 of microwave guide 16 are strip lines or micro-strip lines, whereas line section 38 is formed as a coplanar waveguide.

Line sections 34 and 38 form integrated compensation structures for the compensation of reflections in contact region 12. Section 22 forms a 50 ohm micro-strip line by arrangement over metallic coating 24 (ground). Line section 36 of microwave guide 16 likewise forms a 50 ohm micro-strip line, with here a tuning having been made to metallic coating 28 at the lower side of carrier 20.

Electromagnetic waves can be respectively coupled in or coupled out due to the design of contact region 12 in accordance with the invention. In this connection either microwave guide 14 can be the input and microwave guide 16 the output or, in the reverse case, microwave guide 16 the input and microwave guide 14 the output. For example, a signal with a frequency of up to 40 GHz, reflection values of <27 dB result for the monolithically integrated micro-wave guide component in accordance with the invention. The transmission damping at the transition amounts to below 0.3 db here. In addition to the integration of the compensation structures into contact region 12, it results as a further advantage that, on the assembly of microwave guide component 10, chip 18 can be applied in a self-adjusting manner to carrier 20. Contacting takes places by soldering, with the adjustment of chip 18 on carrier 20 taking place in a self-adjusting manner by the surface tension of the solder in the area of contact region 12. Differences in tolerance on assembly can hereby be reduced to a minimum so that the occurrence of parasitic elements in contact region 12—which could have an effect on the compensation—are negligibly small.

While this invention has been described as having a preferred design the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A monolithically integrated microwave guide component for radio frequency overcoupling, comprising:

a microwave guide chip;

a first microwave guide carried by said microwave guide chip;

a carrier substrate;

a second microwave guide carried by said carrier substrate;

a chip through-contact electrically connecting said first microwave guide and said second microwave guide in a contact region;

a reflection compensation structure integrally connected with each of said first microwave guide and said second microwave guide in said contact region; and a metallic coating arranged between said microwave guide chip and said carrier substrate, said reflection compensation structure having a portion in a plane of said metallic coating, said portion having a free end, said carrier substrate having through contacts that are arranged symmetrically around said free end.

2. The microwave guide component of claim 1, wherein said first microwave guide includes a capacitively acting line section in said contact region.

3. The microwave guide component of claim 2, wherein said capacitively acting line section includes a thinner line section, a thicker line section, and a taper structure interconnecting said thinner line section and said thicker line section.

4. The microwave guide component of claim 1, wherein said second microwave guide includes an inductively acting line section in said contact region.

5. The microwave guide component of claim 4, wherein said inductively acting line section comprises a coplanar waveguide.

6. The microwave guide component of claim 1, wherein said first microwave guide includes a capacitively acting line section in said contact region, and said second microwave guide includes an inductively acting line section in said contact region, said capacitively acting line section and said inductively acting line section each being configured as one of strip lines and micro-strip lines.

7. The microwave guide component of claim 1, further including a metallic coating arranged between said microwave guide chip and said carrier substrate, said metallic coating including a recess in said contact region.

8. The microwave guide component of claim 1, wherein said through contacts are substantially equidistance from said chip through-contact.

* * * * *